(12) United States Patent
Jeong et al.

(10) Patent No.: US 8,748,867 B2
(45) Date of Patent: Jun. 10, 2014

(54) LIGHT EMITTING DEVICE

(75) Inventors: Jong Pil Jeong, Seoul (KR); Jung Hyun Hwang, Seoul (KR); Sang Hyun Lee, Seoul (KR); Se Hwan Sim, Seoul (KR); Sung Yi Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 52 days.

(21) Appl. No.: 13/359,064

(22) Filed: Jan. 26, 2012

(65) Prior Publication Data

US 2012/0187369 A1    Jul. 26, 2012

(30) Foreign Application Priority Data

Jan. 26, 2011 (KR) .................. 10-2011-0007926
Sep. 8, 2011 (KR) .................. 10-2011-0091400

(51) Int. Cl.
*H01L 29/06* (2006.01)
(52) U.S. Cl.
USPC .................................................. 257/15
(58) Field of Classification Search
USPC .................. 257/15, 87, 95; 438/29
See application file for complete search history.

(56) References Cited

U.S. PATENT DOCUMENTS

| 6,329,667 | B1 * | 12/2001 | Ota et al. .................... 257/13 |
| 7,611,917 | B2 * | 11/2009 | Emerson et al. ............... 438/42 |
| 7,646,027 | B2 * | 1/2010 | Bandoh ....................... 257/79 |
| 2007/0122994 | A1 * | 5/2007 | Sonobe et al. ................ 438/426 |
| 2008/0099781 | A1 * | 5/2008 | Choi et al. ................... 257/103 |
| 2009/0032828 | A1 * | 2/2009 | Romano et al. ............... 257/94 |
| 2009/0085057 | A1 * | 4/2009 | Park et al. ................... 257/103 |
| 2010/0019225 | A1 * | 1/2010 | Lee ........................... 257/13 |
| 2010/0155704 | A1 * | 6/2010 | Oh et al. ..................... 257/28 |

OTHER PUBLICATIONS

Liu, R. et al., 'Generation of misfit dislocations by basal-plane slip in InGaN/GaN heterostructures,' Appl. Phys. Let. vol. 89 2006 p. 201911.*

* cited by examiner

*Primary Examiner* — Fernando L Toledo
*Assistant Examiner* — Bryan Junge
(74) *Attorney, Agent, or Firm* — Birch, Stewart, Kolsch & Birch, LLP

(57) ABSTRACT

Provided are a light emitting device, a method of fabricating the light emitting device, a light emitting device package, and a lighting system. The light emitting device comprises a substrate, a first semiconductor layer containing indium (In) over the substrate, and a light emitting structure over the first semiconductor layer. A dislocation mode is disposed on a top surface of the first semiconductor layer.

18 Claims, 7 Drawing Sheets
(2 of 7 Drawing Sheet(s) Filed in Color)

LIGHT EMITTING DEVICE

CROSS-REFERENCE TO RELATED APPLICATIONS

This application claims under 35 U.S.C. §119 to Korean Patent Application No. 10-2011-0007926, filed Jan. 26, 2011 and Korean Patent Application No. 10-2011-0091400, filed Sep. 8, 2011, which are hereby incorporated by reference in their entireties.

BACKGROUND

Embodiments relate to a light emitting device, a method of fabricating the light emitting device, a light emitting device package, and a lighting system.

Light emitting devices (LEDs) are compound semiconductor devices that convert electric energy into light energy. Here, a compositional ratio of a compound semiconductor may be adjusted to realize various colors.

When a forward voltage is applied into a light emitting device, the light emitting device emits light having energy corresponding to an energy gap between a conduction band and a valance band due to combination between electrons within an N-type layer and holes within a P-type layer. The energy may be mainly emitted in a heat or light state. Here, the light emitting device emits the energy in the light state.

For example, Nitride semiconductors attract a great attention in the optical device and high-power electronic device development fields because of their high thermal stability and wide band gap energy. In particular, blue, green and UV light emitting devices using nitride semiconductors have been commercialized and widely used.

Nitride semiconductor light emitting devices include a nitride semiconductor layer that is organic-chemically deposited over a sapphire substrate being a hetero-substrate.

That is, since the nitride semiconductor layer is formed on the hetero-substrate such as sapphire, SiC, or Si, dislocation density may be increased because of lattice mismatching due to hetero-junction. Thus, the increase of the dislocation density has a bad impact on reliability and light emitting efficiency of the light emitting device.

SUMMARY

Embodiments provide a light emitting device having improved reliability, a method of fabricating the light emitting device, a light emitting device package, and a lighting system.

Embodiments also provide a light emitting device having improved light emitting efficiency, a method of fabricating the light emitting device, a light emitting device package, and a lighting system.

In one embodiment, a light emitting device comprises: a substrate; a first semiconductor layer containing indium (In) over the substrate; and a light emitting structure over the first semiconductor layer, wherein a dislocation mode is disposed on a top surface of the first semiconductor layer.

In another embodiment, a light emitting device comprises: a substrate; a first conductive type semiconductor layer over the substrate; an active layer over the first conductive type semiconductor layer; and a second conductive type semiconductor layer over the active layer, wherein an indium-containing first semiconductor layer is disposed between the first conductive type semiconductor layer and the active layer, and a dislocation mode is disposed on a top surface of the first semiconductor layer.

Embodiments may provide the light emitting device having the improved reliability, the method of fabricating the light emitting device, the light emitting device package, and the lighting system.

Embodiments may also provide the light emitting device having the improved light emitting efficiency, the method of fabricating the light emitting device, the light emitting device package, and the lighting system.

The details of one or more embodiments are set forth in the accompanying drawings and the description below. Other features will be apparent from the description and drawings, and from the claims.

BRIEF DESCRIPTION OF THE DRAWINGS

The patent or application file contains at least one color drawing. Copies of this patent or patent application publication with color drawing will be provided by the USPTO upon request and payment of the necessary fee.

DETAILED DESCRIPTION OF THE EMBODIMENTS

Hereinafter, a light emitting device, a light emitting device package, and a lighting system according to embodiments will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

First Embodiment

Figure 1:
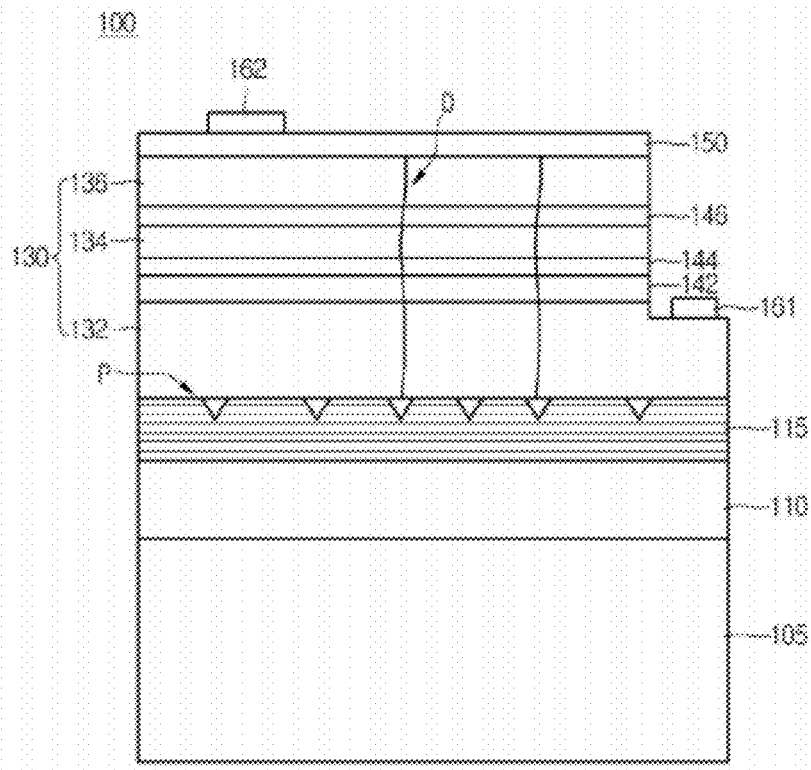
FIG. 1 is a sectional-view of a light emitting device according to a first embodiment.

FIG. 1 is a sectional view of a light emitting device 100 according to a first embodiment.

The light emitting device 100 according to the current embodiment includes a substrate 105, a first semiconductor layer 115 containing indium (In) on the substrate 105, and an active layer 134 on the first semiconductor layer 115 containing the indium (In).

The indium-containing first semiconductor layer 115 may have one of an $In_xGa_{1-x}N$ (0<x≤1) structure, an $In_xGaN_{1-x}$/GaN (0<x≤1) superlattice structure, and an InN/GaN superlattice structure.

The substrate 105 may include a conductive substrate or an insulating substrate. For example, the substrate 105 may be formed of one of ($Al_2O_3$), SiC, Si, GaAs, GaN, ZnO, GaP, InP, Ge, and $Ga_2O_3$. A roughness structure may be disposed on the substrate 105, but is not limited thereto. A wet cleaning process may be performed on the substrate 105 to remove impurities from a surface of the substrate 105.

A buffer layer 110 may be disposed on the substrate 105. The buffer layer may reduce lattice mismatching between a material of a light emitting structure and the substrate 105. The buffer layer may be formed of at least one of group III-V compound semiconductors, for example, undoped GaN, InN, AlN, InGaN, AlGaN, InAlGaN, and AlInN.

The indium-containing first semiconductor layer 115 may be disposed on the buffer layer 110. For example, the indium-containing first semiconductor layer 115 may have one of an $In_xGa_{1-x}N$ (0<x≤1) structure, an $In_xGaN_{1-x}$/GaN (0<x≤1) superlattice structure, and an InN/GaN superlattice structure.

In the current embodiment, it is intended to provide a light emitting device having high reliability. For this, dislocations generated between the substrate 105 and the nitride semiconductor layer may be previously uniformly controlled at the lowermost portion to improve reliability. Also, carrier may be smoothly introduced to improve performance of the device.

In a first conductive type semiconductor layer 132 disposed on the substrate 105, each of dislocations may be increased in size due to a compressive stress to generate pits.

While the pits are generated, carrier inequality may occur around the pits to reduce a resistance. Thus, circumferences of the pits may serve as leakage paths. To restrict the carrier inequality, the indium-containing first semiconductor layer 115 may be inserted into a lower portion of the first conductive type semiconductor layer 132 to control the dislocations D so that the dislocations D are uniformly distributed. Thus, a stable current flow may be realized at an upper portion of the first conductive type semiconductor layer 132.

In the current embodiment, the indium-containing first semiconductor layer 115 may have one of an $In_xGa_{1-x}N$ (0<x≤1) structure, an $In_xGaN_{1-x}$/GaN (0<x≤1) superlattice structure, and an InN/GaN superlattice structure. Thus, due to the indium having a relatively large size, the pits P may occur. Also, the dislocations D may be uniformly distributed by the occurring pits P to prevent the dislocations D from being concentrated. Thus, it may prevent the device from being failed.

Also, since the occurrence of the dislocations D is not limited to a specific position, the indium-containing first semiconductor layer 115 functioning as a dislocation control layer in the current embodiment may be disposed on an entire surface of the substrate 105 to perform the dislocation control function.

The indium-containing first semiconductor layer 115 may be realized as a single layer or a multi layer. When the indium-containing first semiconductor layer 115 has an $In_xGaN_{1-x}$/GaN (0<x≤1) superlattice structure or an InN/GaN superlattice structure, one pair to three pairs of indium-containing first semiconductor layer 115 may be provided, but is not limited thereto.

The indium-containing first semiconductor layer 115 may have a thickness of about 30 Å to about 500 Å. When the indium-containing first semiconductor layer 115 has a thickness greater than about 500 Å, pits may excessively occur. Also, the single layer may have a thickness of about 30 Å, but is not limited thereto.

In the current embodiment, when the indium-containing first semiconductor layer 115 may have an $In_xGa_{1-x}N$ (0<x≤1) structure or an $In_xGaN_{1-x}$/GaN (0<x≤1) superlattice structure, a composition ratio X of the indium may be set to a range from about 2% to about 5% (0.02≤x≤0.05). When a composition ratio of the indium is less than about 2%, pits may not occur. When a composition ratio of the indium exceeds about 5%, the indium may be lumped and thus be unable to perform a pit occurrence function. Also, when a composition ratio of the indium exceeds about 5%, the indium may be volatilized in the first conductive type semiconductor layer formation process performed at a high temperature.

Figure 2:
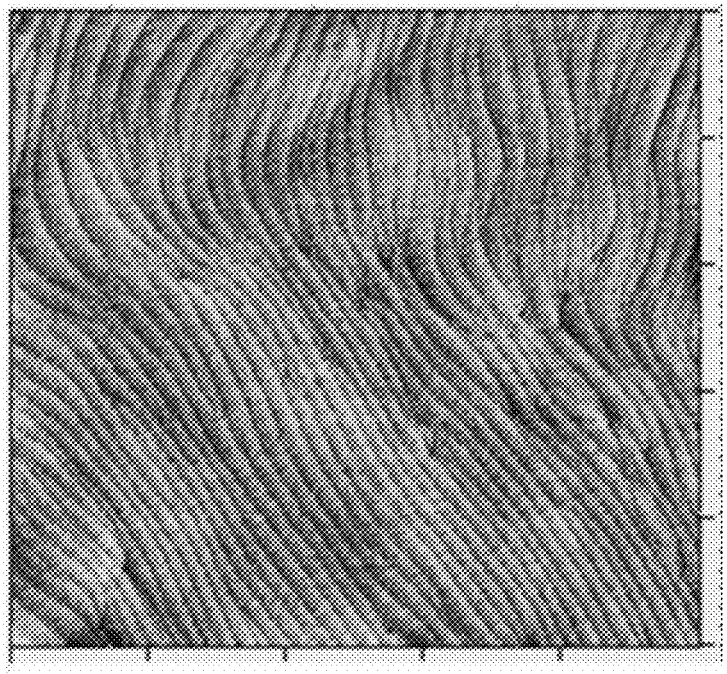
FIG. 2 is a view of a GaN template AFM image in a light emitting device according to an embodiment.
Figure 3:
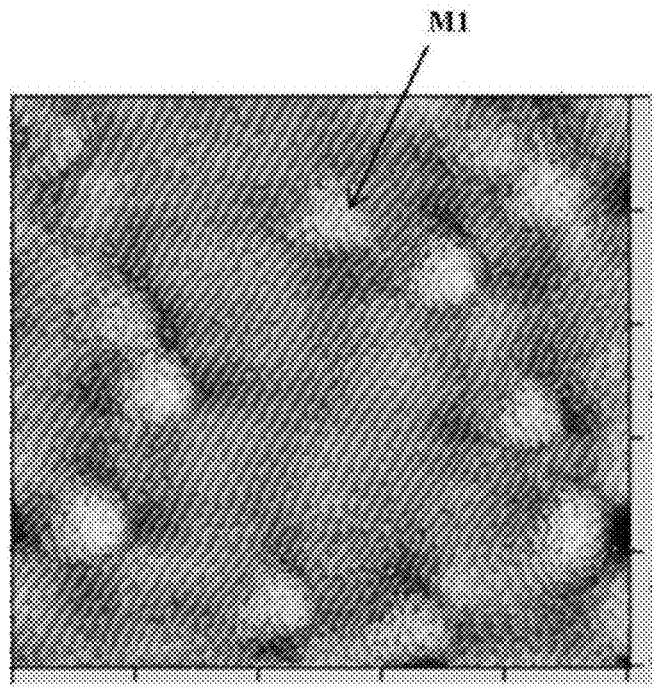
FIGS. 3 and 4 are views of a dislocation mode AFM image in a light emitting device according to an embodiment.
Figure 4:
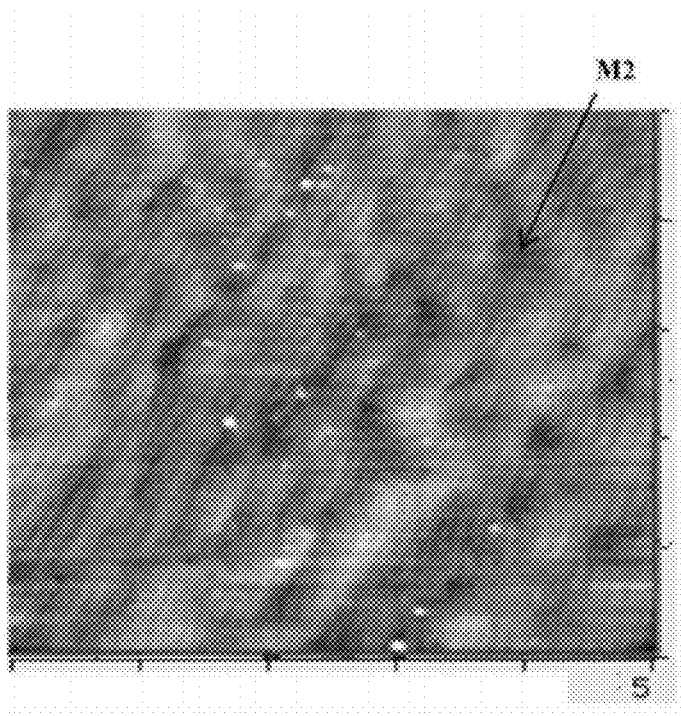

FIG. 2 is a view illustrating an atomic force microscope (AFM) image of a GaN template in a light emitting device according to an embodiment. FIGS. 3 and 4 are views of a dislocation mode AFM image in a light emitting device according to an embodiment.

In the current embodiment, a dislocation mode may be formed on a top surface of the indium-containing first semiconductor layer 115.

For example, when a GaN template AFM image is displayed as shown in FIG. 2 in a light emitting device according to a comparative example, dislocation mode M1 or M2 may be formed on the indium-containing first semiconductor layer 115. The dislocation mode M1 or M2 may be provided in plurality. The plurality of dislocation modes may be uniformly distributed. The dislocations D may be uniformly controlled by the uniformly distributed dislocation modes to improve reliability of the device. Referring again to FIG. 1, the first conductive type semiconductor layer 132 may be formed of a group III-V compound semiconductor doped with a first conductive type dopant. When the first conductive type semiconductor layer 132 is an N-type semiconductor layer, the first conductive type dopant may include Si, Ge, Sn, Se, and Te as an N-type dopant, but is not limited thereto.

The first conductive type semiconductor layer 132 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

In the current embodiment, a current spreading layer 142 and an electron injection layer 144 may be disposed on the first conductive type semiconductor layer 132.

The current spreading layer 142 may include an undoped nitride semiconductor layer, but is not limited thereto. For example, the current spreading layer 142 may have a thickness of about 3000 Å to about 5000 Å at a temperature of about 1000° C. to about 1100, a pressure of about 150 torr to about 250 torr.

Since the current spreading layer 142 is grown at a temperature greater than a growth temperature of the first conductive type semiconductor layer 132, the current spreading layer 142 may fill the roughness and have a flat top surface. Thus, each of layers to be formed on the current spreading layer 142 may have superior crystalline.

Thereafter, the electron injection layer 144 may be disposed on the current spreading layer 142. The electron injection layer 144 may be a first conductive type nitride gallium semiconductor layer. For example, the electron injection layer 144 may be doped with an N-type doping element such as Si and have a thickness of about 1000 Å or less, but are not limited thereto.

For example, the electron injection layer 144 may be doped with the N-type doping element at a concentration of $6.0 \times 10^{18}$ atoms/cm$^3$ to $8.0 \times 10^{18}$ atoms/cm$^3$. Thus, the electrons may be effectively injected.

Thereafter, an active layer 134 may be disposed on the electron injection layer 144.

The active layer 134 may be a layer in which electrons injected through the first conductive type semiconductor layer 132 meet holes injected through a second conductive type semiconductor layer 136 to be formed later to emit light having energy determined by the natural energy band of the active layer 114 (light emitting layer).

The active layer 134 may have at least one of a single quantum well structure, a multi quantum well (MQW) structure, a quantum wire structure, and a quantum dot structure.

A well layer/barrier layer of the active layer 134 may have a pair structure of at least one of InGaN/GaN, InGaN/InGaN, GaN/AlGaN, InAlGaN/GaN, GaAs(InGaAs)/AlGaAs, and GaP(InGaP)/AlGaP, but is not limited thereto. The well layer may be formed of a material having a band gap less than that of the barrier layer.

In the current embodiment, an electron blocking layer 146 may be disposed on the active layer 134.

In the current embodiment, the electron injection layer 146 may be disposed on the active layer 134 to perform an electron blocking function and MQW cladding of the active layer 134, thereby improving light emitting efficiency. For example, the electron blocking layer 146 may be formed of a semiconductor having a compositional formula of $Al_xIn_yGa_{(1-x-y)}N$ ($0 \leq x \leq 1$, $0 \leq y \leq 1$). Also, the electron blocking layer 146 may have an energy band gap greater than that of the active layer 134 and a thickness of about 100 Å to about 600 Å.

Also, the electron blocking layer 146 may have an $Al_zGa_{(1-z)}N/GaN$ ($0 \leq z \leq 1$) superlattice structure, but is not limited thereto.

The electron blocking layer 146 may be doped with P-type ions to efficiently block electrons and improve injection efficiency of holes. For example, the electron blocking layer 146 may be doped with Mg at a concentration of about $10^{18}$/cm$^3$ to $10^{20}$/cm$^3$ to efficiently block overflowing electrons and improve injection efficiency of holes.

The second conductive type semiconductor layer 136 is disposed on the electron blocking layer 146.

The second conductive type semiconductor layer 136 may be formed of a group III-V compound semiconductor that is doped with a second conductive type dopant, e.g., a semiconductor material having a compositional formula of $In_xAl_yGa_{1-x-y}N$ ($0 \leq x \leq 1$, $0 \leq y \leq 1$, $0 \leq x+y \leq 1$). When the second conductive type semiconductor layer 136 is a P-type semiconductor layer, the second conductive type dopant may include Mg, Zn, Ca, Sr, and Ba as a P-type dopant.

In the embodiment, the first conductive type semiconductor layer 132 may be realized as the N-type semiconductor layer, and the second conductive type semiconductor layer 136 may be realized as the P-type semiconductor layer, but are not limited thereto. Also, a semiconductor having a polarity opposite to that of the second conductive type semiconductor layer 136, e.g., an N-type semiconductor layer (not shown) may be disposed on the second conductive type semiconductor layer 136. Accordingly, the light emitting structure may have one of an N-P junction structure, a P-N junction structure, an N-P-N junction structure and a P-N-P junction structure.

Thereafter, an ohmic layer 150 is disposed on the second conductive type semiconductor layer 136.

For example, the ohmic layer 150 may be provided as a multi layer of a metal, a metal alloy, and a metal oxide to efficiently inject the carriers. For example, the ohmic layer (150) may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—GaZnO), IGZO (In—GaZnO), ZnO, $IrO_x$, $RuO_x$, NiO, $RuO_x$/ITO, Ni/$IrO_x$/Au, and Ni/$IrO_x$/Au/ITO, Ag, Ni, Cr, Ti, Al, Rh, Pd, Ir, Ru, Mg, Zn, Pt, Au, and Hf, but is not limited thereto.

Thereafter, a mesa etching process may be performed to expose a portion of the first conductive type semiconductor layer 132 to dispose a first electrode 161 on the exposed first conductive type semiconductor layer 132. Then, a second electrode 162 may be disposed on the ohmic layer 150.

Embodiments may provide a light emitting device having improved reliability, a method of fabricating the light emitting device, a light emitting device package, and a lighting system.

Second Embodiment

Figure 5A:
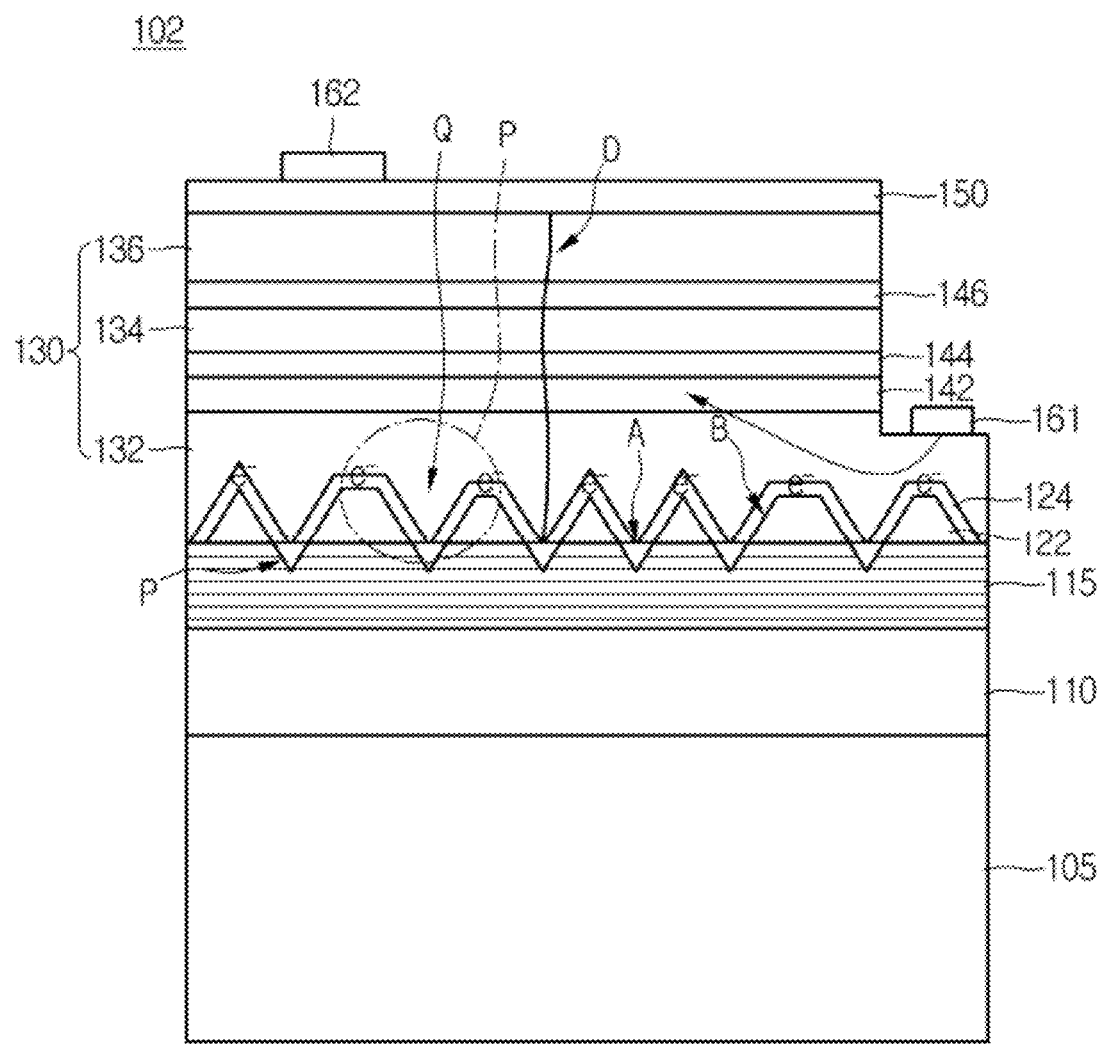
FIG. 5A is a sectional view of a light emitting device according to a second embodiment.
Figure 5B:
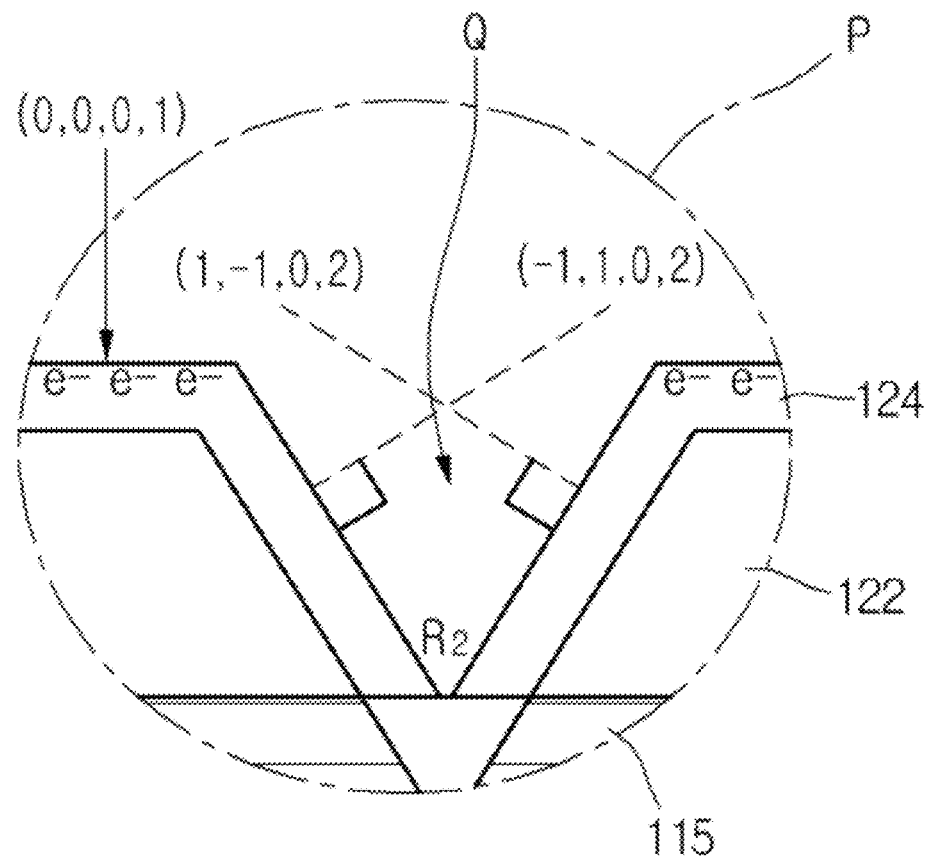
FIG. 5B is a partially enlarged sectional view of the light emitting device according to the second embodiment.

FIG. 5A is a sectional view of a light emitting device 102 according to a second embodiment. FIG. 5B is an enlarged illustrating a portion P of a wedge-type embayment portion Q in the light emitting device according to an embodiment. The wedge-type embayment portion Q may be called a protrusion portion, but is not limited thereto.

The light emitting device 102 according to the second embodiment may adopt the technical properties of the light emitting device 100 according to the first embodiment.

The second embodiment may further include an undoped semiconductor layer 122 having a protrusion portion B and a recessed portion A on an indium (In)-containing first semiconductor layer 115 and a nitride semiconductor superlattice layer 124 on the undoped semiconductor layer 122.

When a large amount of carriers is injected by a first electrode 161, a flow of electron carriers has an influence on a lower portion of the light emitting device 102. Thus, it may be necessary to provide a layer for preventing the electron carriers from flowing downward. In the second embodiment, the undoped semiconductor layer 122 and the nitride semiconductor superlattice layer 124 may be adequately used to prevent the carriers from flowing downward, thereby allowing the carriers to be spread.

Also, in the second embodiment, the recessed portion A of the undoped semiconductor layer 122 and the nitride semiconductor superlattice layer 124 may control dislocations again to uniformly distribute the dislocations without allowing the dislocations D to be lumped with each other, thereby improving reliability of the device.

As shown in FIG. 5B, in the second embodiment, the wedge-type embayment portion Q may be disposed on a top surface of the undoped semiconductor layer 122.

For example, the wedge-type embayment portion Q may be manufactured by adjusting a temperature and pressure when the undoped semiconductor layer 122 is grown.

For example, when the undoped semiconductor layer 122 is grown at a temperature of about 550° C. to about 940° C. and a pressure of about 100 torr to about 500 torr, the wedge-type embayment portion Q may be defined in a top surface of the undoped semiconductor layer.

The recessed portion A may have a triangular shape in section. When viewed from an upper side, the recessed portion A may have a hexagonal shape. For example, the recessed portion A may have a hexagonal hone shape, but is not limited thereto.

As described above, the roughness may be selectively provided on a portion in which the dislocations D are generated. Here, since the recessed portion A of the roughness has a resistance greater than that of the protrusion portion B, the portion in which the dislocations D are generated may be increased in resistance to define a high resistance region.

Thus, when static electricity is applied, a current concentrated through the dislocations D may be blocked by the high resistance region to reduce a leakage current due to the dislocations D, thereby improving an ESD resistance of the light emitting device 100. Here, electrons that serve as carriers may be moved through the protrusion portion B having a low resistance and superior crystalline.

For example, the first semiconductor layer 115 may have one of an $In_xGa_{1-x}N$ ($0<x\leq1$) structure, an $In_xGaN_{1-x}/GaN$ ($0<x\leq1$) superlattice structure, and an InN/GaN superlattice structure. When the first semiconductor layer 115 is grown using a semiconductor material having a compositional formula of $In_xAl_yGa_{1-x-y}N$, the wedge-type embayment portion Q may have a triangular shape defined by a first inclined surface (1,−1,0,2) and a second inclined surface (−1,10,2) which are two inclined surfaces connected to a growth surface (0,0,0,1) of the first semiconductor layer 115 as shown in FIG. 5B. When viewed in a plane, the wedge-type embayment portion Q may have a hexagonal shape. Thus, the wedge-type embayment portion Q may have a hexagonal hone shape, but is not limited thereto.

As described above, the wedge-type embayment portion Q may be selectively provided in the portion in which the dislocations D are generated. Since a peak portion of the wedge-type embayment portion Q has a resistance R2 greater than that of the growth surface (0,0,0,1) of the first semiconductor layer 115, the portion in which the dislocations D are generated may be increased in resistance. Thus, when static electricity is applied, a current concentrated through the dislocations D may be blocked to reduce the leakage current due to the dislocations D, thereby improving an ESD resistance of the light emitting device 102. Here, the current may be moved through the growth surface (0,0,0,1) of the first semiconductor layer 115 having a low resistance and superior crystalline.

In the second embodiment, a nitride semiconductor superlattice layer 124 may be disposed on the protrusion portion B of the undoped semiconductor layer 122. For example, an AlGaN/GaN superlattice layer 124 having a thickness of about 10 Å to about 1000 Å may be further disposed on the undoped semiconductor layer 122. The AlGaN/GaN superlattice layer 124 may be doped with an N-type doping element such as Si.

The nitride semiconductor superlattice layer 124 may prevent the dislocations D from being transferred into an active layer 134 or uniformly control the dislocations D without allowing the dislocations D to be lumped with each other to improve the crystalline, thereby improving light emitting efficiency and reliability of the light emitting device 102.

According to the second embodiment, the electrons may smoothly supplied in a region of the protrusion portion B, and a region of the recessed portion A that is a high resistance region may prevent the dislocations D from being expanded. Thus, the leakage current may be interrupted to prevent an operation voltage from being increased.

Third Embodiment

Figure 6:
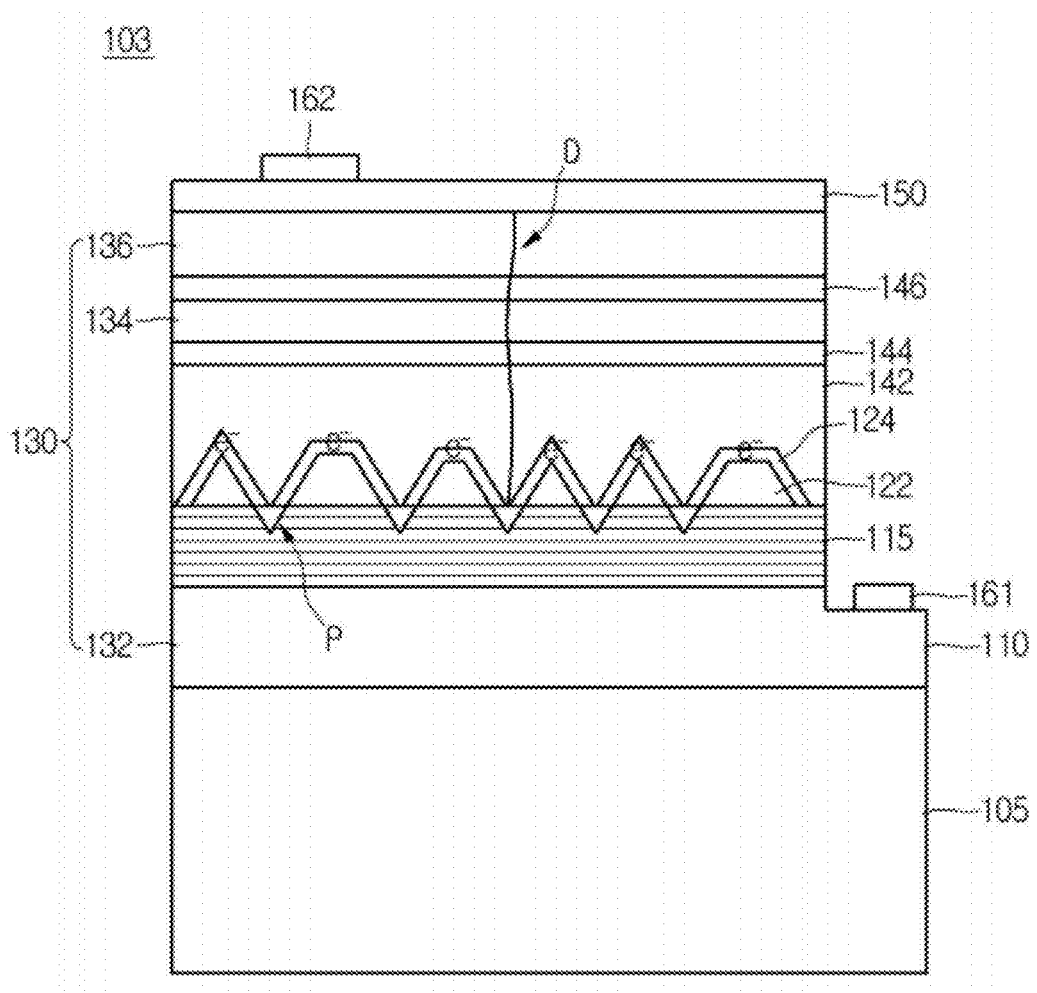
FIG. 6 is a sectional view of a light emitting device according to a third embodiment.

FIG. 6 is a sectional view of a light emitting device 103 according to a third embodiment.

The third embodiment may adopt the technical properties of the first and second embodiments.

In the third embodiment, an indium-containing first semiconductor layer 115 may be disposed on a first conductive type semiconductor layer 132. Also, a portion of the indium-containing first semiconductor layer 115 except for a light emitting structure may be removed to form a first electrode 161.

According to the third embodiment, the indium-containing first semiconductor layer 115 may serve as a current spreading layer to prevent carriers from being concentrated. Thus, a current may smoothly flow to improve light emitting efficiency and reliability of the light emitting device 103.

Embodiments may provide a light emitting device having improved reliability, a method of fabricating the light emitting device, a light emitting device package, and a lighting system.

Figure 7:
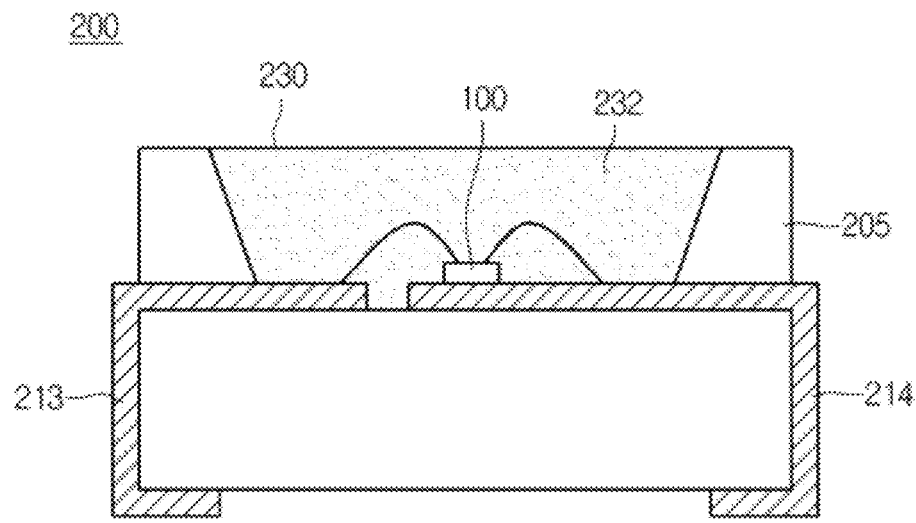
FIG. 7 is a sectional view of a light emitting device package according to an embodiment.

FIG. 7 is a sectional view illustrating a light emitting device package 200 including the light emitting device according to embodiments.

Referring to FIG. 7, the light emitting device package 200 according to an embodiment includes a package body 205, third and fourth electrode layers 213 and 214 disposed on the package body 205, a light emitting device 100 disposed on the package body 205 and electrically connected to the third and fourth electrode layers 213 and 214, and a molding member 230 surrounding the light emitting device 100.

The package body 205 may be formed of a silicon material, a synthetic resin material, or a metal material. An inclined surface may be disposed around the light emitting device 100.

The third electrode layer 213 and the fourth electrode layer 214 may be electrically separated from each other and also supply power to the light emitting device 100. Also, the third electrode layer 213 and the fourth electrode layer 214 may reflect light generated in the light emitting device 100 to improve light efficiency, and may release heat generated in the light emitting device 100 to the outside.

The light emitting device 100 may be applied to the lateral type light emitting device exemplified in FIG. 1, but the present disclosure is not limited thereto. For example, the light emitting device 100 may be applied to the light emitting device 102 according to the second embodiment, the light emitting device 103 according to the third embodiment, or a flip-chip type light emitting device.

The light emitting device 100 may be disposed on the package body 205 or the third or fourth electrode layer 213 or 214.

The light emitting device 100 may be electrically connected to the third and/or fourth electrode layers 213 and/or 214 through one of a wiring process, a flip-chip process, and a die bonding process. Although the light emitting device 100 is electrically connected to the third and fourth conductive layers 213 and 124 through wires in the current embodiment, the present disclosure is not limited thereto.

The molding member 230 may surround the light emitting device 100 to protect the light emitting device 100. Also, the molding member 230 may include a phosphor 232 to vary a wavelength of light emitted form the light emitting device 100.

The light emitting device package 200 may be provided in plurality on a board, and optical members such as a light guide plate, a prism sheet, a diffusion sheet, and a fluorescent sheet may be disposed in a path of light emitted from the light emitting device package 200. The light emitting device package 200, the board, and the optical members may function as a backlight unit or a lighting unit. For example, a lighting system may include backlight units, lighting units, indicating devices, lamps, and street lamps.

Figure 8:
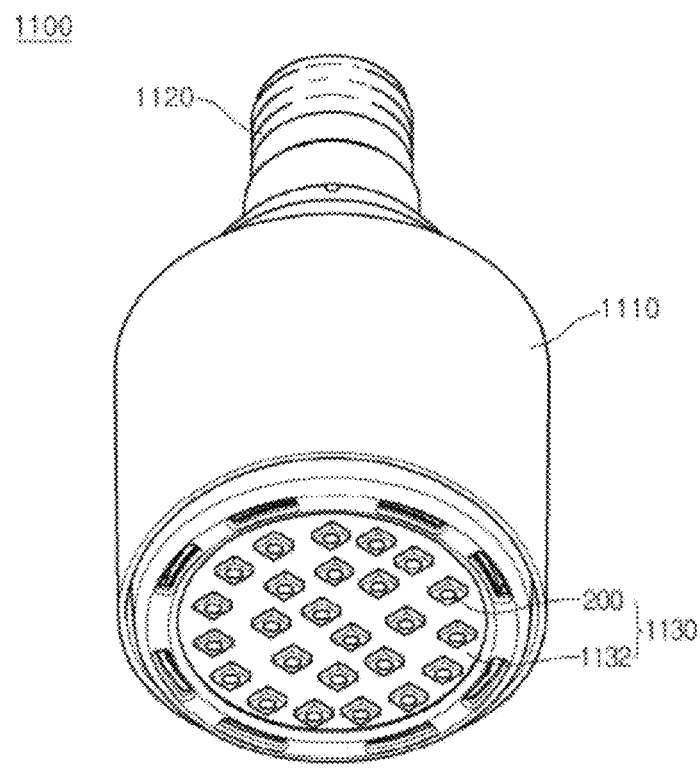
FIG. 8 is a perspective view of a lighting unit according to an embodiment.

FIG. 8 is a perspective view of a lighting unit 1100 according to an embodiment. However, the lighting unit 1100 of FIG. 8 is described as an example of the lighting system. Thus, the present disclosure is not limited thereto.

Referring to FIG. 8, the lighting unit 1100 may include a case body 1110, a light emitting module 1130 disposed on the case body 1110, and a connection terminal 1120 disposed on the case body 1110 to receive power from an external power source.

The case body 1110 may be formed of a material having good thermal dissipation properties, e.g., a metal material or a resin material.

The light emitting module 1130 may include a board 1132 and at least one light emitting device package 200 mounted on the board 1132.

A circuit pattern may be printed on a dielectric to manufacture the board 1132. For example, the board 1132 may include a printed circuit board (PCB), a metal core PCB, a flexible PCB, and a ceramic PCB.

Also, the board 1132 may be formed of a material which may effectively reflect light or have a color by which light is effectively reflected, e.g., a white color or a silver color.

The at least one light emitting device package 200 may be mounted on the board 1132. The light emitting device package 200 may include at least one light emitting diode (LED) 100. The LED may include color LEDs, which respectively emit light having a red color, a green color, a blue color, and a white color and an ultraviolet (UV) LED emitting UV rays.

The light emitting module 1130 may have combinations of several light emitting devices 200 to obtain desired color and brightness. For example, the white LED, the red LED, and the green LED may be combined with each other to secure a high color rendering index (CRI).

The connection terminal 1120 may be electrically connected to the light emitting module 1130 to supply power to the light emitting module 1130. Referring to FIG. 8, the connection terminal 1120 is screw-coupled to an external power source in a socket manner, but is not limited thereto. For example, the connection terminal 1120 may have a pin shape, and thus, be inserted into the external power source. Alternatively, the connection terminal 1120 may be connected to the external power source by a wire.

Figure 9:
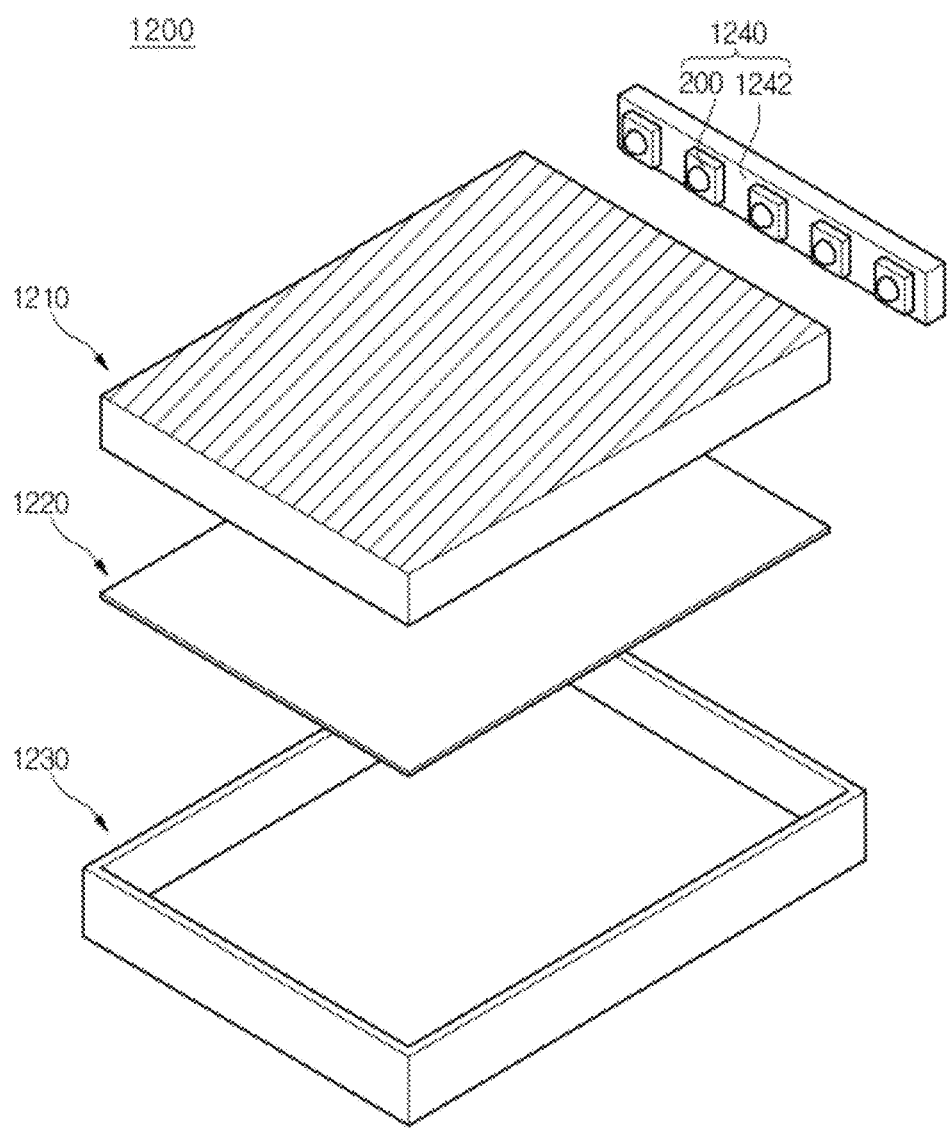
FIG. 9 is a perspective view of a backlight unit according to an embodiment.

FIG. 9 is an exploded perspective view of a backlight unit 1200 according to an embodiment. However, the backlight unit 1200 of FIG. 9 is described as an example of the lighting system. Thus, the present disclosure is not limited thereto.

The backlight unit 1200 according to the current embodiment may include a light guide plate 1210, a light emitting module 1240 providing light to the light guide plate 1210, a reflective member 1220 under the light guide plate 1210, and a bottom cover 1230 receiving the light guide plate 1210, the light emitting module 1240, and the reflective member 1220, but is not limited thereto.

The light guide plate 1210 diffuses light to produce planar light. For example, the light guide plate 1210 may be formed of a transparent material, e.g., one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 may provide light to at least one surface of the light guide plate 1210. Thus, the light emitting module 1240 may serve as a light source of a display device including the backlight unit 1200.

The substrate 1240 may contact the light guide plate 1210, but is not limited thereto. Specifically, the light emitting module 1240 may include a board 1242 and a plurality of light emitting device packages 200 mounted on the board 1242. Here, the board 1242 may contact the light guide plate 1210, but is not limited thereto.

The board 1242 may be a printed circuit board (PCB) including a circuit pattern (not shown). Alternatively, the board 1242 may include a metal core PCB (MCPCB) or a flexible PCB (FPCB) as well as a general PCB, but is not limited thereto.

The plurality of light emitting device packages 200 may be mounted on the board 1242 so that a light emission surface through which light is emitted is spaced a predetermined distance from the light guide plate 1210.

The reflective member 1220 may be disposed under the light guide plate 1210. Since the reflective member 1220 reflects light incident onto an under surface of the light guide plate 1210 to supply the light upward, the brightness of the backlight unit 1200 may be improved. For example, the reflective member 1220 may be formed of one of PET, PC, and PVC resins, but is not limited thereto.

The bottom cover 1230 may receive the light guide plate 1210, the light emitting module 1240, and the reflective member 1220. For this, the bottom cover 1230 may have a box shape with an opened upper side, but is not limited thereto.

The bottom cover 1230 may be formed of a metal material or a resin material. Also, the bottom cover 1230 may be manufactured using a press molding process or an extrusion molding process.

Embodiments may provide the light emitting device having the improved reliability, the method of fabricating the light emitting device, the light emitting device package, and the lighting system.

Embodiments may provide the light emitting device having the improved light emitting efficiency, the method of fabricating the light emitting device, the light emitting device package, and the lighting system.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a first semiconductor layer containing indium (In) over the substrate;

an undoped semiconductor layer comprising a protrusion portion and a recessed portion over the first semiconductor layer; and a light emitting structure over the undoped semiconductor layer, wherein a dislocation mode is disposed on a top surface of the first semiconductor layer, wherein the recessed portion has a resistance greater than that of the protrusion portion, wherein the protrusion portion and the recessed portion constitute a wedge-type embayment portion, and wherein the wedge-type embayment portion comprises a peak having a resistance greater than that of a growth surface of the first semiconductor layer.

2. The light emitting device according to claim 1, wherein the dislocation mode comprises a plurality of dislocation modes, and the plurality of dislocation modes are uniformly distributed.

3. The light emitting device according to claim 1, wherein the first semiconductor layer comprises one of an $In_xGaN_{1-x}$/GaN ($0<x\leq1$) superlattice structure and an InN/GaN superlattice structure.

4. The light emitting device according to claim 1, further comprising a nitride semiconductor superlattice layer over the undoped semiconductor layer.

5. The light emitting device according to claim 4, wherein the nitride semiconductor superlattice layer is directly disposed on the undoped semiconductor layer.

6. The light emitting device according to claim 4, wherein at least one pit is disposed between the protrusion portion and another protrusion portion of the undoped semiconductor layer.

7. The light emitting device according to claim 6, wherein the nitride semiconductor superlattice layer is disposed on a top surface of the at least one pit.

8. The light emitting device according to claim 1, wherein the light emitting structure comprises:
    a first conductive type semiconductor layer;
    an active layer over the first conductive type semiconductor layer; and
    a second conductive type semiconductor layer over the active layer.

9. The light emitting device according to claim 8, further comprising:
    a first electrode in a region in which a portion of the first conductive type semiconductor layer is exposed; and
    a second electrode over the second conductive type semiconductor layer.

10. The light emitting device according to claim 1, wherein the first semiconductor layer comprises an $In_xGa_{1-x}$ ($0<x\leq1$) structure or an $In_xGaN_{1-x}$/GaN ($0<x\leq1$) superlattice structure.

11. The light emitting device according to claim 10, wherein a composition ratio (X) of the indium (In) ranges from about 0.02 to about 0.05.

12. A light emitting device comprising:
    a substrate;
    a first conductive type semiconductor layer over the substrate;
    an indium-containing first semiconductor layer over the first conductive type semiconductor layer;
    an undoped semiconductor layer comprising a protrusion portion and a recessed portion over the indium-containing first semiconductor layer;
    an active layer over the undoped semiconductor layer; and
    a second conductive type semiconductor layer over the active layer,
    wherein a dislocation mode is disposed on a top surface of the first semiconductor layer,
    wherein the recessed portion has a resistance greater than that of the protrusion portion,
    wherein the protrusion portion and the recessed portion constitute a wedge-type embayment portion, and
    wherein the wedge-type embayment portion comprises a peak having a resistance greater than that of a growth surface of the first semiconductor layer.

13. The light emitting device according to claim 12, wherein the dislocation mode comprises a plurality of dislocation modes, and the plurality of dislocation modes are uniformly distributed.

14. The light emitting device according to claim 12, further comprising:
    a first electrode in a region in which a portion of the first conductive type semiconductor layer under the first semiconductor layer is exposed; and
    a second electrode over the second conductive type semiconductor layer.

15. The light emitting device according to claim 12, further comprising a nitride semiconductor superlattice layer over the undoped semiconductor layer.

16. The light emitting device according to claim 15, wherein the nitride semiconductor superlattice layer is directly disposed on the undoped semiconductor layer.

17. The light emitting device according to claim 15, wherein at least one pit is disposed between the protrusion portion and another protrusion portion of the undoped semiconductor layer.

18. The light emitting device according to claim 17, wherein the nitride semiconductor superlattice layer is disposed on a top surface of the at least one pit.

* * * * *